United States Patent
Zeng et al.

(10) Patent No.: US 10,157,983 B2
(45) Date of Patent: Dec. 18, 2018

(54) VERTICAL POWER MOS-GATED DEVICE WITH HIGH DOPANT CONCENTRATION N-WELL BELOW P-WELL AND WITH FLOATING P-ISLANDS

(71) Applicant: MaxPower Semiconductor Inc., San Jose, CA (US)

(72) Inventors: Jun Zeng, Torrance, CA (US); Mohamed N. Darwish, Campbell, CA (US); Wenfang Du, Chengdu (CN); Richard A. Blanchard, Los Altos, CA (US); Kui Pu, Chengdu (CN); Shih-Tzung Su, Shulin (TW)

(73) Assignee: MAXPOWER SEMICONDUCTOR INC., San Jose, CA (US)

( * ) Notice: Subject to any disclaimer, the term of this patent is extended or adjusted under 35 U.S.C. 154(b) by 0 days.

(21) Appl. No.: 15/894,811

(22) Filed: Feb. 12, 2018

(65) Prior Publication Data

US 2018/0261666 A1 Sep. 13, 2018

Related U.S. Application Data

(60) Provisional application No. 62/469,468, filed on Mar. 9, 2017.

(51) Int. Cl.
| | |
|---|---|
| H01L 29/02 | (2006.01) |
| H01L 29/06 | (2006.01) |
| H01L 29/10 | (2006.01) |
| H01L 29/78 | (2006.01) |
| H01L 29/423 | (2006.01) |

(Continued)

(52) U.S. Cl.
CPC ...... *H01L 29/0634* (2013.01); *H01L 29/1095* (2013.01); *H01L 29/407* (2013.01); *H01L 29/4236* (2013.01); *H01L 29/7397* (2013.01); *H01L 29/7813* (2013.01)

(58) Field of Classification Search
CPC ............ H01L 29/0634; H01L 29/1095; H01L 29/407; H01L 29/4236; H01L 29/7397; H01L 29/7813
See application file for complete search history.

(56) References Cited

U.S. PATENT DOCUMENTS

| | | |
|---|---|---|
| 9,761,702 B2 | 9/2017 | Zeng et al. |
| 2016/0359029 A1 | 12/2016 | Zeng et al. |
| 2016/0372578 A1 | 12/2016 | Levy et al. |

OTHER PUBLICATIONS

USPTO as ISA for PCT/US2018/018248, "International Search Report and Written Opinion", 8 pages.

*Primary Examiner* — Elias M Ullah
(74) *Attorney, Agent, or Firm* — Patent Law Group LLP; Brian D. Ogonowsky

(57) ABSTRACT

In one embodiment, a power MOSFET or IGBT cell includes an N-type drift region grown over the substrate. An N-type layer, having a higher dopant concentration than the drift region, is then formed over the drift region. A P-well is formed over the N-type layer, and an N+ source/emitter region is formed in the P-well. A gate is formed over the P-well's lateral channel and has a vertical extension into a trench. A positive gate voltage inverts the lateral channel and increases the vertical conduction in the N-type layer along the sidewalls of the trench to reduce on-resistance. A vertical shield field plate is also in the trench and may be connected to the gate. The field plate laterally depletes the N-type layer when the device is off to increase the breakdown voltage. Floating P-islands in the N-type drift region increase breakdown voltage and reduce the saturation current.

20 Claims, 8 Drawing Sheets

(51) Int. Cl.
*H01L 29/739* (2006.01)
*H01L 29/40* (2006.01)

VERTICAL POWER MOS-GATED DEVICE WITH HIGH DOPANT CONCENTRATION N-WELL BELOW P-WELL AND WITH FLOATING P-ISLANDS

CROSS REFERENCE TO RELATED APPLICATIONS

This application claims priority from U.S. provisional application Ser. No. 62/469,468, filed Mar. 9, 2017, by Jun Zeng et al., incorporated herein by reference.

FIELD OF INVENTION

The present invention relates to vertical power MOSFETs and insulated gate bipolar transistors (IGBTs) and, in particular, to such a transistor with improved on-resistance and forward voltage drop, as well as a higher breakdown voltage.

BACKGROUND

Vertical MOSFETs and IGBTs are popular as high voltage, high power transistors due to the ability to provide a thick, low dopant concentration drift layer to achieve a high breakdown voltage in the off state. Typically, in an example of a MOSFET, the transistor includes a highly doped N-type substrate, a thick low dopant concentration N-type drift layer, a P-type body layer formed in the drift layer, an N-type source at the top of the body layer, and a gate separated from the channel region by a thin gate oxide. A source electrode is formed on the top surface, and a drain electrode is formed on the bottom surface. In an example of an IGBT, the N-type substrate is replaced with a P-type substrate. When the gate is sufficiently positive with respect to the source, the channel region of the P-type body between the N-type source and the N-type drift layer inverts to create a conductive path between the source (or emitter for an IGBT) and drain (or collector for an IGBT). For an IGBT, the initial current initiates regenerative action to turn on a vertical PNP bipolar transistor.

In the device's off-state, when the gate is shorted to the source or negative, the drift layer depletes, and high breakdown voltages, such as exceeding 600 volts, can be sustained between the source and drain. However, due to the required low doping of the thick drift layer, the on-resistance suffers. Increasing the doping of the drift layer, without increasing its thickness, reduces the on-resistance but lowers the breakdown voltage.

The Applicant had improved on the basic vertical MOSFET and IGBT structure and received U.S. Pat. No. 9,761,702 for such improvements. U.S. Pat. No. 9,761,702 is incorporated herein by reference and includes a detailed method for manufacturing such MOSFETs and IGBTs. In this present disclosure, Applicant further improves on the MOSFET and IGBT devices disclosed in U.S. Pat. No. 9,761,702.

FIG. 9A of Applicant's U.S. Pat. No. 9,761,702 is reproduced herein as prior art FIG. 1. FIG. 1 is believed to be the closest prior art for an IGBT embodiment. FIG. 1 is a cross-sectional view of a single vertical IGBT transistor cell (which may be a portion of a strip or a hexagonal cell) in an array of identical contiguous cells connected in parallel, where the gate 10 includes a vertical portion 12 surrounding a portion of a vertical side wall of a trench for improved on-resistance, and wherein a vertical shield field plate 14 is also in the trench for increasing breakdown voltage.

In one typical application, a load is connected between the bottom electrode 16 and a positive voltage supply, and the top emitter electrode 18 is connected to ground. The combination of the N++ and P regions connected to the electrode 18 are generally referred to as an emitter for the PNP transistor in an IGBT. The load may instead be connected between the emitter electrode 18 and ground. The emitter electrode 18 contacts the N++ emitter region 19. When a positive voltage is applied to the conductive gate 10 that is greater than the threshold voltage, the top surface of the P-well 20 is inverted and electrons accumulate along the vertical sidewalls of the N− layer 22 adjacent to the vertical extension 12 of the gate 10 to spread the current and lower the on-resistance of the N-layer 22.

A self-aligned enhanced N-surface region 24 (N-Surf) surrounds the edge of the P-well 20 and extends to the trench sidewall. The N-surface region 24 has a doping concentration that is higher than that of the N− layer 22. The vertical extension 12 of the gate 10 accumulates electrons in the N-surface region 24 to further lower its on-resistance. Therefore, the N-surface region 24 provides a lower on-resistance and better current spreading without adversely affecting the breakdown voltage.

A P+ contact region 26 ohmically connects the P-well 20 to the emitter electrode 18. The P+ contact region 26 and P-well 20 form part of the emitter.

A dielectric 28, such as oxide, insulates the emitter electrode 18 and the gate 10, and covers the trench sidewalls.

The N++ emitter region 19, the P-well 20, and the N-surface region 24 form a lateral DMOS transistor portion of the IGBT 30. In the on-state, there is a conductive channel between the emitter electrode 18 and the N− layer 22.

The combination of the lateral DMOS transistor portion, the higher doping of the N surface region 24, the vertical extension 12 of the gate 10, and the reduced thickness of the N—drift region 22/34/36 reduce the on-resistance and forward voltage drop. This structure also increases the breakdown voltage due to the effect of the vertical field plate 14 (connected to the emitter) and speeds up the switching time if the IGBT's internal PN diode becomes forward biased then reversed biased.

The vertical shield field plate 14, in combination with the vertical extension 12 of the gate 10, laterally depletes the N-layer 22 when the IGBT is off to improve the breakdown voltage. The entire N-layer 22 is preferably totally depleted at the onset of breakdown. The N--drift region 22/34/36 is preferably also totally depleted at the onset of breakdown.

The effect of the vertical extension 12 of the gate 10 (accumulates electrons along the sidewall) also allows a reduction of the P-well 20-to-trench spacing, enabling a reduction of the cell pitch and active area while still resulting in a lower on-resistance.

A self-aligned P-shield region 40 is formed below the trenches. In the off-state, the device is reversed biased and the P-shield region 40 lowers the electric field under the trench, since the P-shield region 40 is fully depleted prior to breakdown, which results in a higher breakdown voltage. The P-shield region 40 also serves to laterally deplete the N-layer 22 to further increase the breakdown voltage.

The P-shield region 40 can be floating, but to switch the device on from the off state, the parasitic capacitor resulting from the depletion layer between the P-shield region 40 and N-layers 22 and 34 has to be discharged. Therefore, for a MOSFET, it is preferable to connect the P-shield region 40 to the emitter electrode 18 via the P-well 20 and a P-type connection region in certain locations of the die (not shown). The connection of the P-shield region 40 to the emitter electrode 18 provides a path for current to discharge the capacitor and improves the switching delay during switching the device from the off to the on state. In the case of an IGBT (uses a P+ substrate), since the holes can be supplied through the backside P+ collector (P+ substrate), the effect of the floating P-shield region 40 on switching-off is reduced significantly.

P and N charge balance columns 44 and 46 lower the specific on-resistance (Rsp). The N columns 46 are more highly doped than the N-layer 22 so help reduce on-resistance. The N and P columns 46/44 deplete when the device is off and are preferably fully depleted, along with the P-shield region 40, at the onset of avalanche breakdown.

If the bottom semiconductor of the structure is an N++ substrate, the device is a vertical MOSFET. If the substrate 50 is a P++ type, as shown, the device is an IGBT, which lowers on-resistance at the expense of switching speed. In such a case, the drain electrode 16 becomes an anode or collector electrode. Turning on the IGBT by applying a threshold voltage to the gate 10 turns on the PNP transistor.

Although the device of FIG. 1, whether formed as a MOSFET or IGBT has world-class operating characteristics, there is still a desired to further improve performance.

SUMMARY

In one embodiment, the basic structure of FIG. 1 is modified to form an N-well or additional N-layer directly below and in contact with the P-well. The N-well or additional N-layer has a higher doping concentration than the N-type drift layers below it.

In one embodiment, the transistor has a lateral DMOS channel, using a lateral gate, and a vertical extension of the gate along the side of the P-well and N-well, which results in a lower on-resistance.

If the device is an IGBT (e.g., a P++ substrate), during forward conduction, both electron and hole carrier concentration are raised and the conduction loss of the device (caused by on-resistance) is reduced. The device may instead be formed with an N++ substrate and form a MOSFET.

The device can also be formed using vertical gates within trenches to create a vertical channel through the P-well, where the vertical gate faces the entire side of the added N-layer.

In another embodiment, floating P-islands are formed in the N-drift region. The electric field in the epitaxial drift region becomes more uniformly profiled so that a higher breakdown voltage is achieved. Other advantages are achieved.

BRIEF DESCRIPTION OF DRAWINGS

FIG. 2 is a cross-sectional view of a single vertical transistor cell (which may be a portion of a strip or 2-dimensional array) in an array of identical contiguous cells connected in parallel, where the gate includes a lateral portion and a vertical portion, where an added N-well below the P-well improves on-resistance.

DETAILED DESCRIPTION

Since U.S. Pat. No. 9,761,702 is incorporated herein by reference and includes a detailed method for manufacturing MOSFETs and IGBTs, aspects of the present invention that are similar to those aspects described in Applicant's previous patent are not needed to be again described in detail. This disclosure focuses on the differences between the structures in U.S. Pat. No. 9,761,702 and the present invention. The dimensions and other parameters used in the preferred embodiment may be similar to the dimensions and other parameters described in U.S. Pat. No. 9,761,702.

Figure 1:
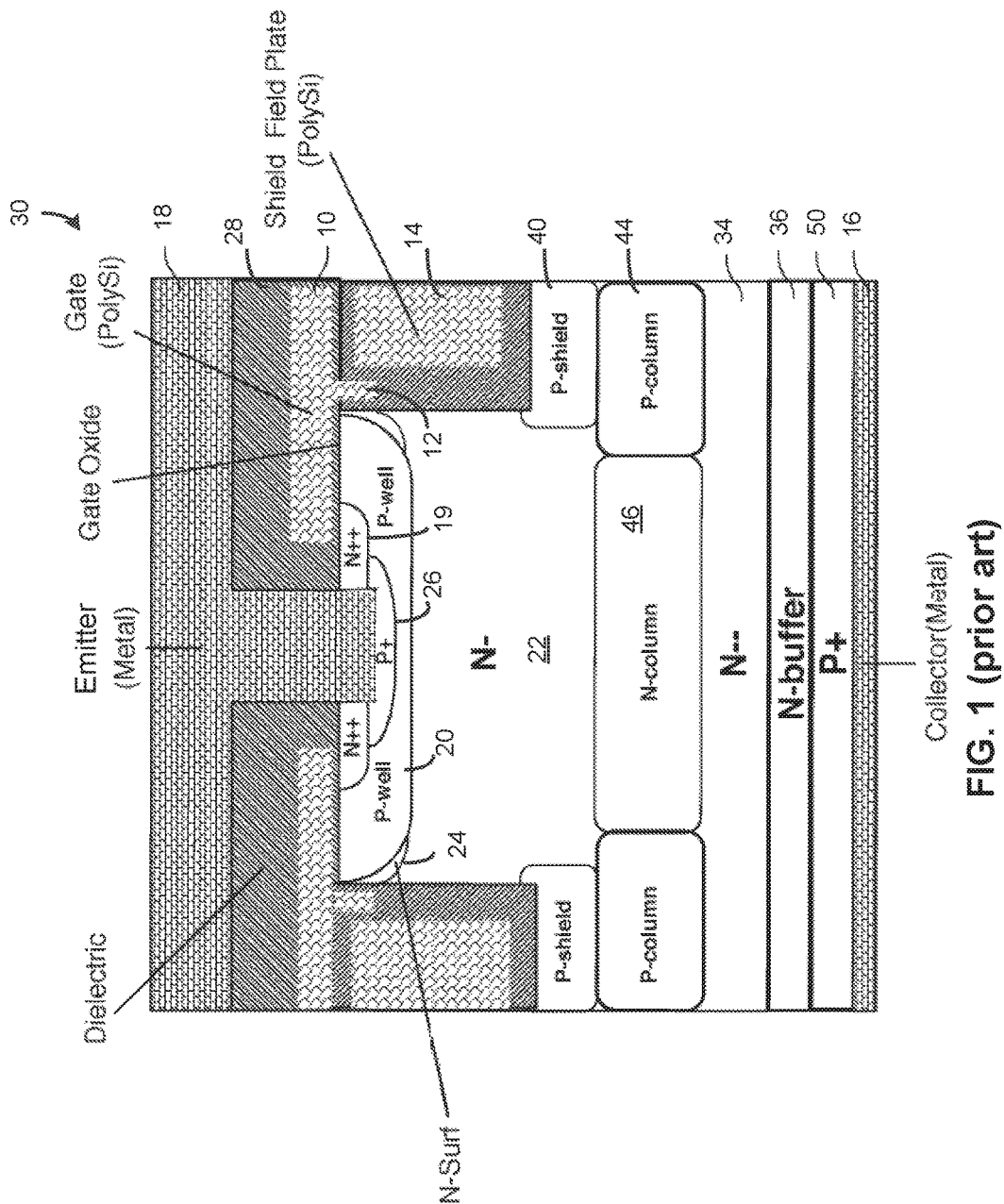
FIG. 1 is FIG. 9A of Applicant's U.S. Pat. No. 9,761,702 and shows an IGBT having a lateral DMOS portion and a vertical insulated gate portion.
Figure 2:
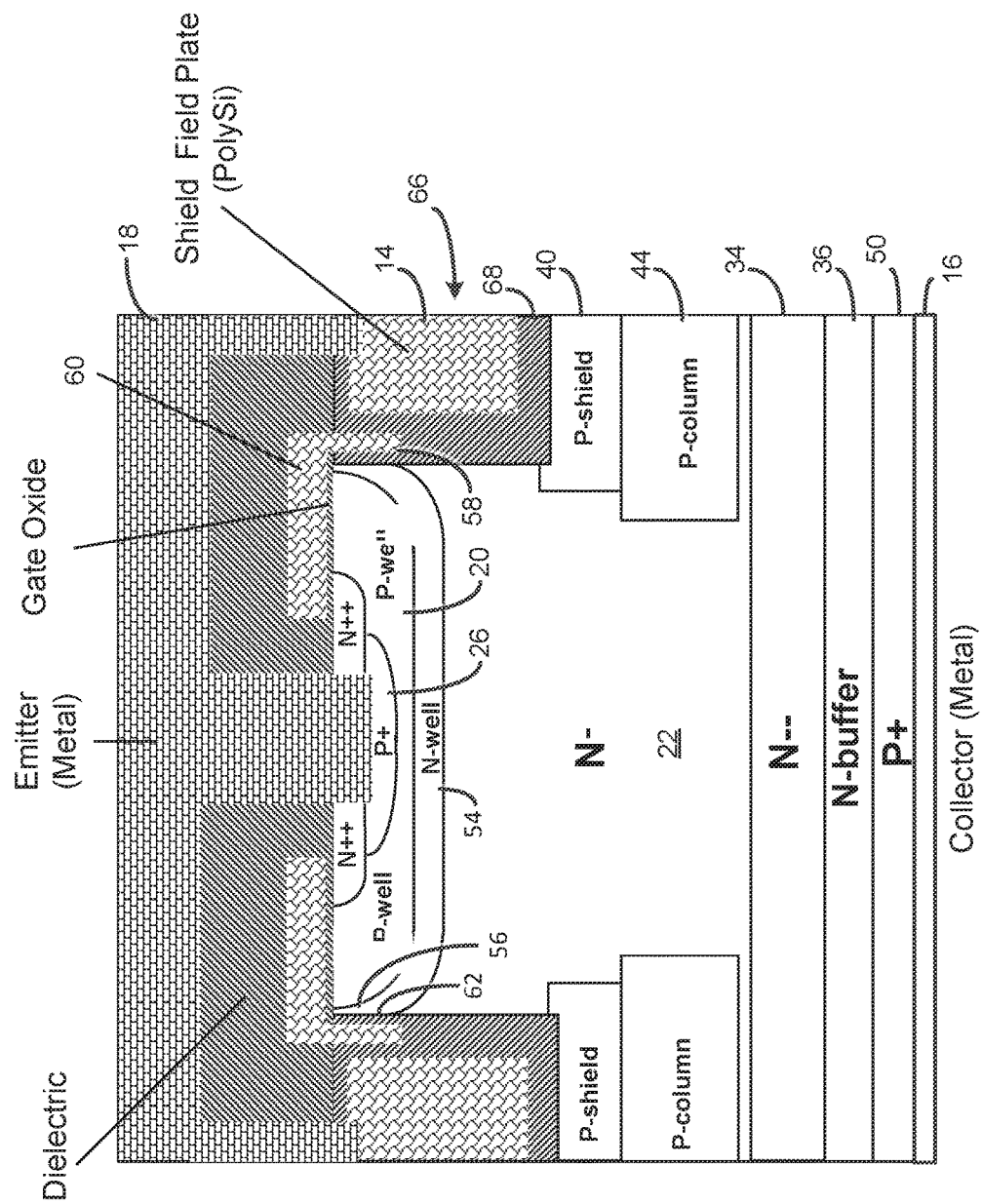
FIG. 2 illustrates an improvement over the IGBT of FIG. 1.

FIG. 2 illustrates an improvement over the IGBT of FIG. 1. Features of FIG. 2 that may be common to the features of FIG. 1 are labeled with the same element numbers and are not again described in detail. In one application, a positive voltage is applied to the bottom electrode 16, and a load is connected between the emitter electrode 18 and ground.

The IGBT of FIG. 2 includes an N-well 54 that abuts and extends below the P-well 20. Side portions 56 of the N-well 54 extend along the sides of the P-well 20 and face the vertical extension 58 of the gate 60. The lateral portion of the gate 60 and the vertical extension 58 are insulated from the silicon by a thin gate oxide 62. Biasing the gate 60 sufficiently high inverts the channel region of the P-well 20 surface under the gate 60 to create a lateral current path. The vertical extension 58 also increases the electron concentration in the N-well 54 along the vertical extension 58 so that there is a low conductivity vertical path between the channel and the N− layer 22 (drift region). Current that has been conducted by the channel can then spread into the low-resistivity N-well 54 and become more spread out to enable higher currents to be conducted. The N-well 54 has a dopant concentration that is higher than that of the N− layer 20 so has a higher conductivity. During the on-state, both electron and hole carrier conduction are raised. Hence, there is a lower on-resistance, and conduction loss is reduced.

The dopant concentration in the N-well 54 may be between 1.5-10 times greater than the dopant concentration in the N-layer 22. The thickness of the N-well 54 depends on the required breakdown voltage, given a certain N-layer 22 thickness.

When MOSFET current begins to flow, the P+ substrate 50 becomes forward biased with respect to the N-layer 22 to turn on the PNP bipolar transistor, so the MOSFET initiates a regenerative current. The IGBT generally has an on-resistance that is lower than a MOSFET. The P+ substrate may be replaced with an N+ substrate to form a vertical MOSFET instead of an IGBT. The advantage of the N-well 54 however remains the same.

The P-shield 40 below the trench 66 lowers the electric field under the trench 66 in the off-state since the P-shield 40 is ideally fully depleted, resulting in a higher breakdown voltage. The P-shield 40 also serves to laterally deplete the N-layer 22 to further increase the breakdown voltage. The P-shield 40 may be floating or connected to the emitter electrode 18 via the P-well 20.

The P columns 44 help balance charge and deplete when the device is off to increase breakdown voltage. The P-shield 40 and P-columns 44 are not needed for realizing the benefits of the added N-well 54.

Oxide 68 or another dielectric insulates the field plate 14 and emitter electrode 18.

Simulations were performed comparing the performance of the device of FIG. 1 (no N-well) to that of FIG. 2. The simulations showed improved forward conduction and switching performance particularly at lower current densities.

The N-well 54 may be formed by the injection of N-type dopants and drive-in, followed by the injection and drive-in of P-type dopants to form the P-well 20.

Figure 3:
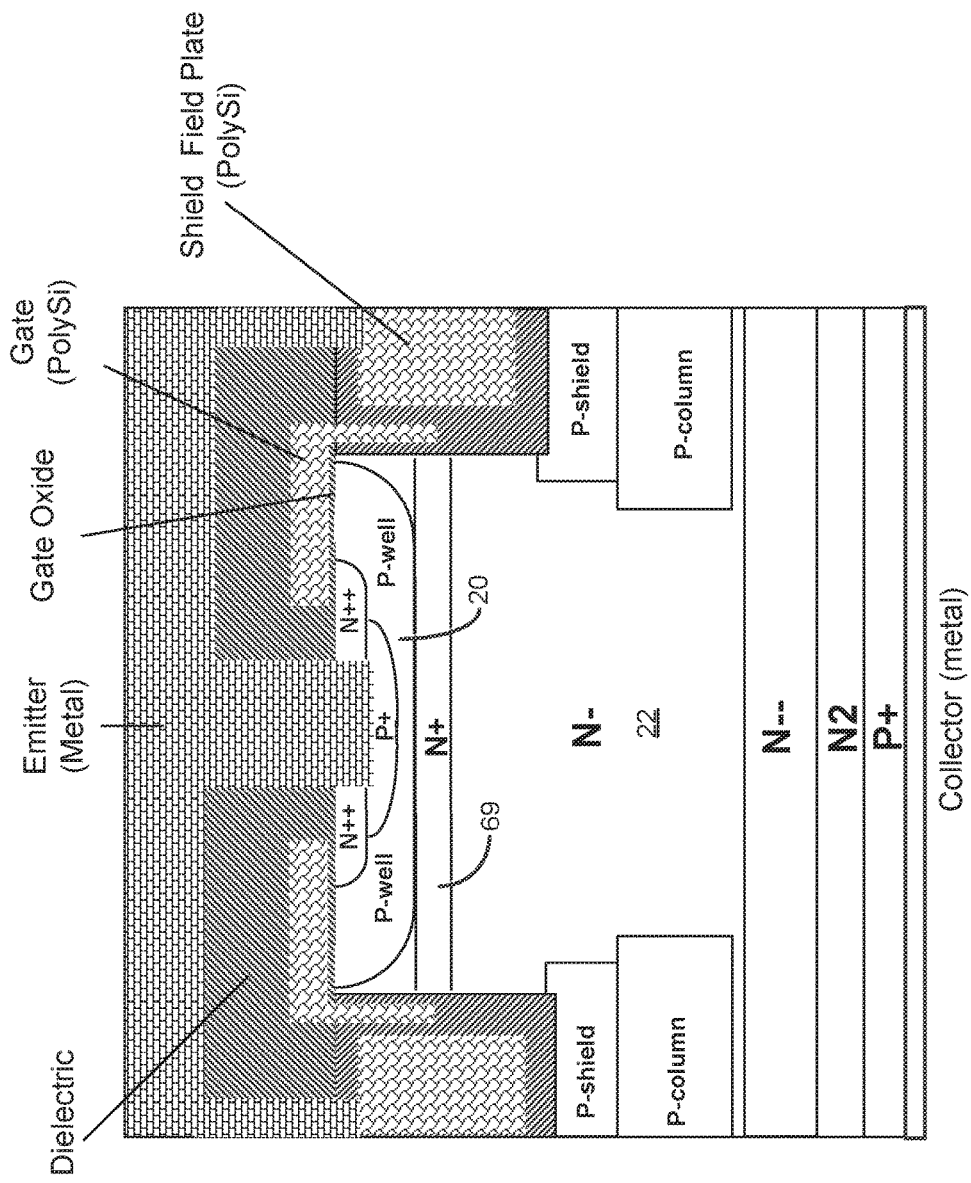
FIG. 3 is similar to FIG. 2 but the added N-well below the P-well is formed by deep implantation to form the N-well as a buried layer.

FIG. 3 illustrates the device of FIG. 2 but where the N-well is formed as an N-buried layer 69 using a deep implant of N-type dopants into the drift region followed by drive-in. The N-buried layer 69 is shown as N+ to indicate it has a dopant concentration that significantly exceeds that of the N-layer 22. The P-well 20 may be formed by implantation or by doping in-situ during epitaxial growth. Note that the vertical extension of the gate, when the gate is biased high, lowers the conductivity of the N-type silicon next to it to reduce on-resistance. The vertical extension of the gate may extend next to a portion of the N-buried layer 69 or completely along the edge of the N-buried layer 69 to lower its conductivity along the edge.

In FIGS. 2 and 3, the shield field plate 14 is shown shorted to the emitter electrode 18 directly within each cell. In other embodiments, the shorting may be accomplished elsewhere on the die.

Figure 4:
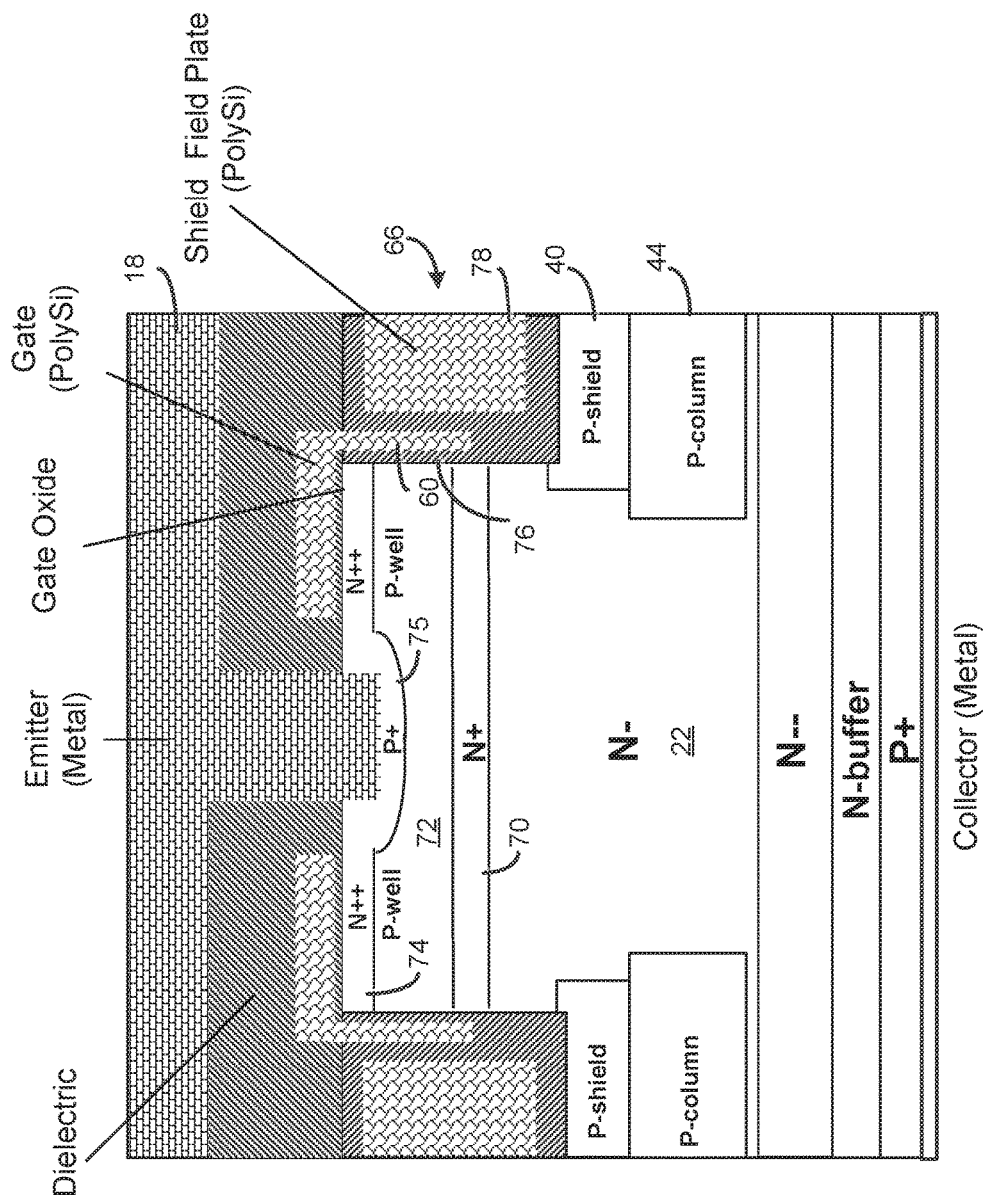
FIG. 4 illustrates an IGBT cell having an N-epitaxial (epi) layer below the P-epi layer, and where the vertical gate is formed in a trench for creating a vertical channel through the and P-epi layer. The N-epi layer has a doping concentration that is higher than the underlying drift region.

FIG. 4 illustrates an IGBT cell having an N-epitaxial (epi) layer 70 below a P-epi layer 72. An N++ emitter epi layer 74 is also formed. Instead of implantation, the epitaxial layers 70, 72, and 74 may be doped in-situ as the layers are being grown. A P+ contact region 75 may be formed by implantation. The trenches 66 are then formed. The trench walls are coated with a thin oxide layer 76, and the trenches 66 are filled with a conductor such as doped polysilicon to form the shield field plates 78. The shield field plate 78 may be connected to the emitter metal 18 outside the drawing. Biasing the gate 60 high forms a vertical inversion layer along the P-epi layer 72 facing the gate 60. Current then flows vertically from the emitter epi layer 74 to the N-epi layer 70, which begins the regeneration process for turning on the PNP transistor in the IGBT.

The N-epi layer 70 has a dopant concentration higher than that of the N− layer 22, so on-resistance is reduced. Biasing the gate 60 also causes electrons to accumulate along the edge of the N-epi layer 70 next to the gate 60 to further lower the on-resistance.

In FIGS. 2-4, the combination of the P-shield 40, P-column 44, and highly doped N-well 54/N-epi layer 70 is utilized to raise carrier concentration in the upper zone of the IGBT such that more idealized conduction carrier profiles can be obtained. Simulations have shown that both electron and hole carrier concentrations inside the P-shield 40 are raised, which means that the P-shield 40 also contributes to forward current conduction. The result is a lower saturation voltage across the IGBT. The Safe Operating Area (SOA) is also improved, where SOA is defined as the voltage and current conditions over which the device can be expected to operate without self-damage.

Figure 5:
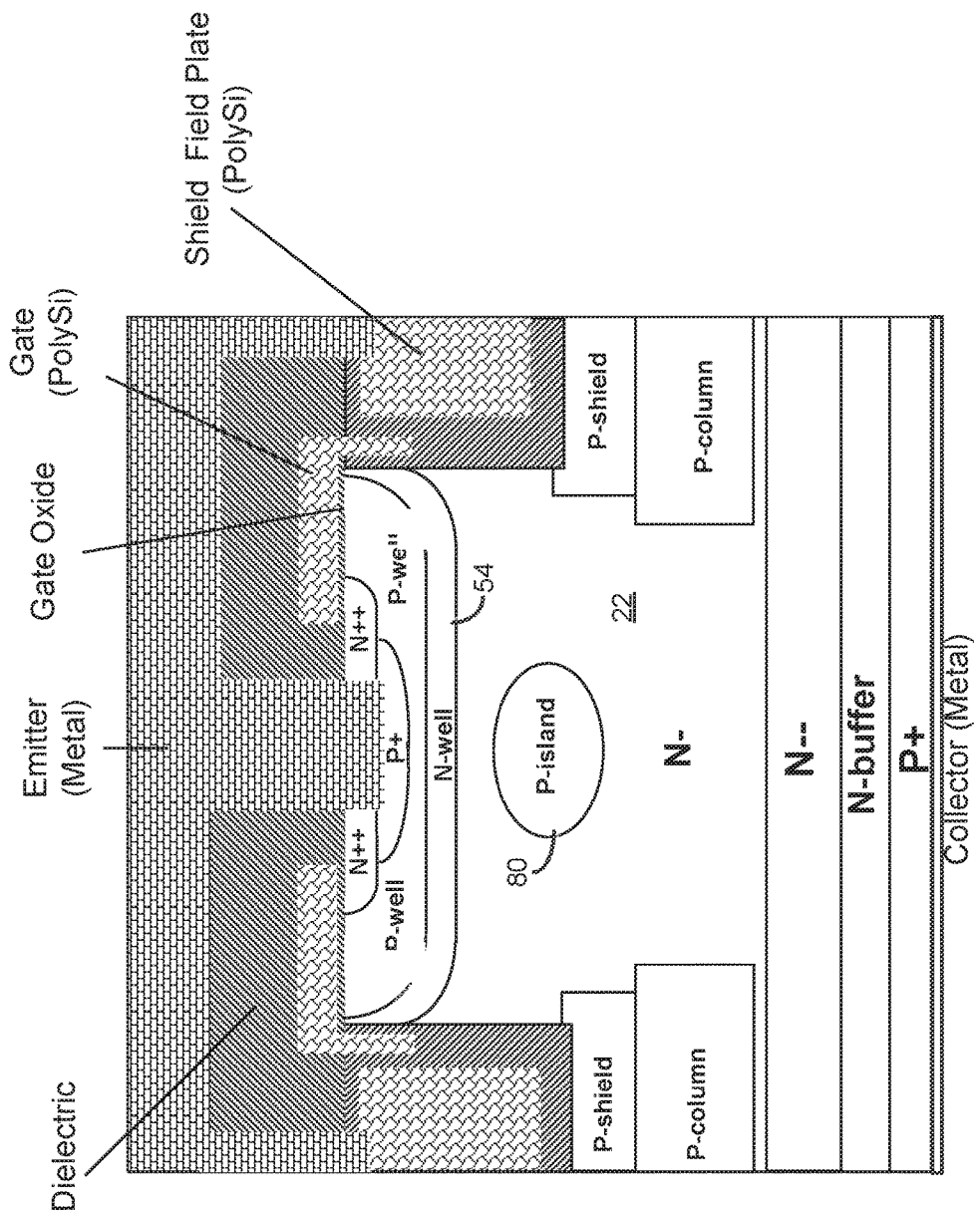
FIG. 5 illustrates the use of a floating P-island for offsetting the charge in the N-drift area in the off-state to improve the depletion of the drift area for increased breakdown voltage. The P-island does not block the current flow through the drift area.

FIG. 5 illustrates an IGBT similar to FIG. 2 but incorporating a floating P-island 80 below the N-well 54. The P-island 80 is formed by implantation of P-type dopants. The P-island 80 may be used with or without the N-well 54. The P-island 80 provides an additional shielding function and results in the IGBT having a lower saturation current when the device operates in the linear mode, while lowering the saturation voltage (VCE(sat)). Additionally, the P-island 80 offsets the charge in the N-drift area in the off-state to improve the depletion of the drift area for increased breakdown voltage. In other words, the electric field inside the structure becomes more uniformly profiled to increase the breakdown voltage. The P-island 80 does not block the current flow through the drift area.

The addition of the P-island 80 also provides a higher short circuit switching capability and more rugged operation.

The advantage of the P-island 80 is achieved whether the device is an IGBT or a MOSFET.

Figure 6:
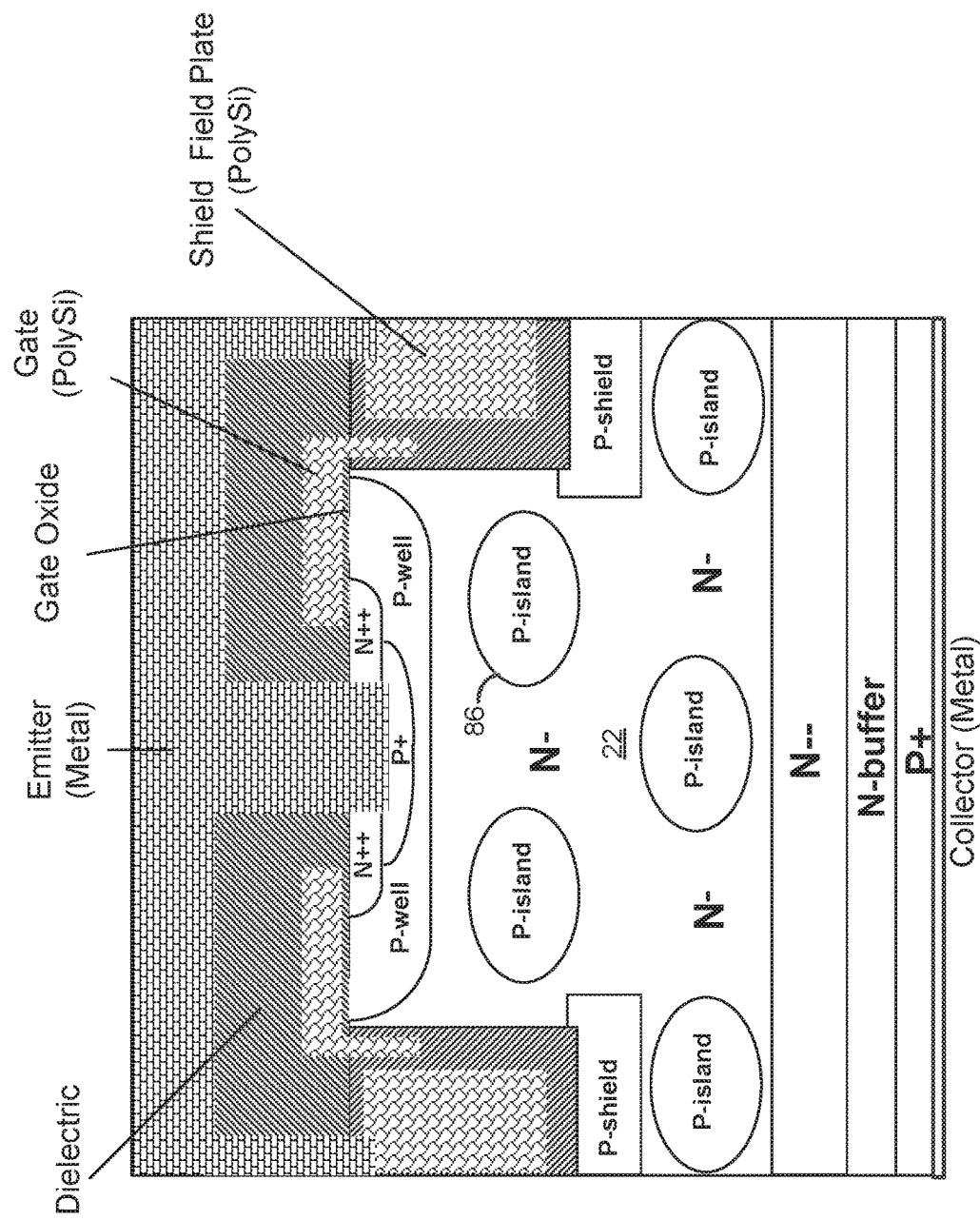
FIG. 6 illustrates that the P-islands may be scattered in the N-type drift area.

FIG. 6 illustrates that the P-islands 86 may be scattered in the N-layer 22.

Figure 7:
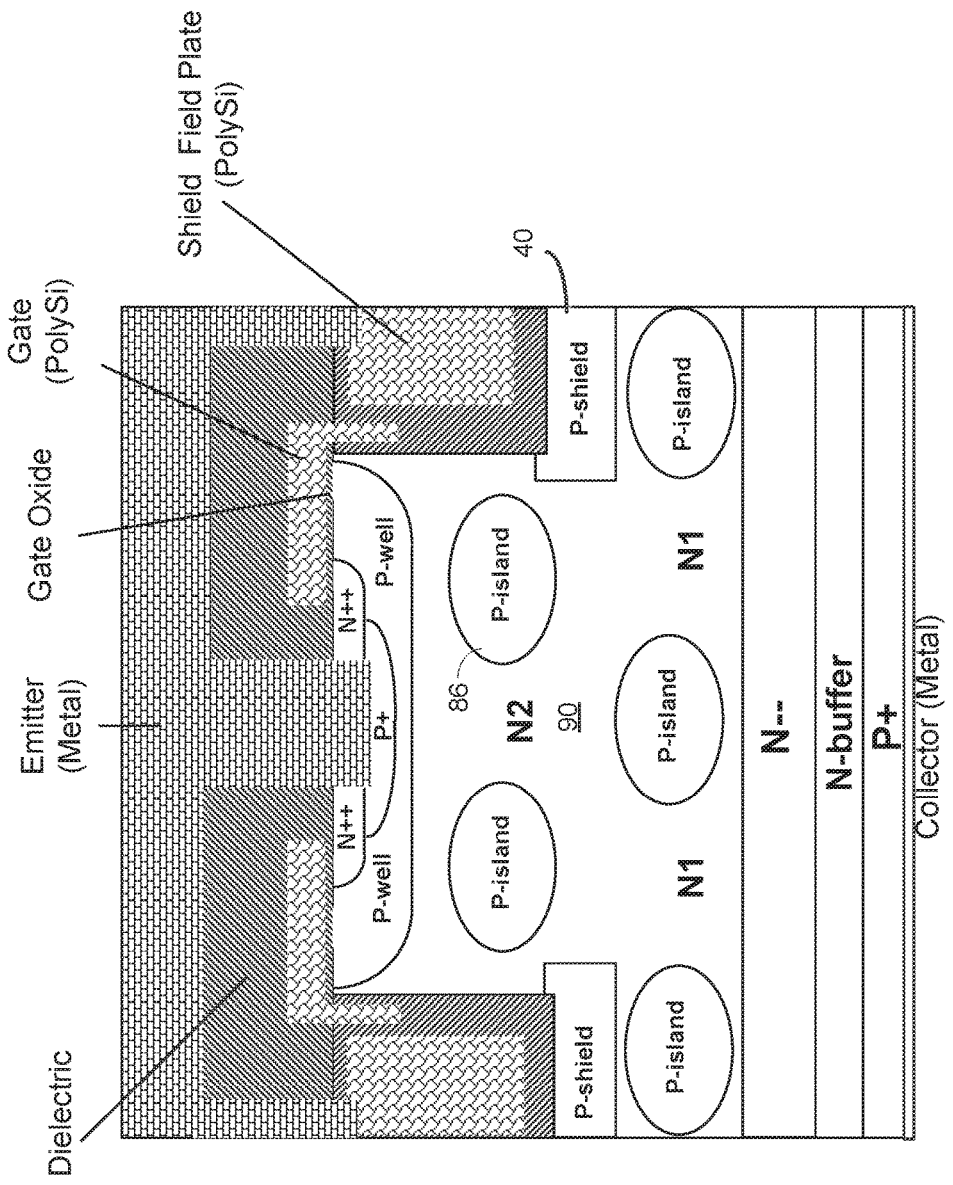
FIG. 7 is similar to FIG. 6 but the drift area has a higher N-type dopant concentration near the top.

In the example of FIG. 7, the upper portion of the drift region 90 has a dopant concentration N2 that is higher than the dopant concentration N1 in the lower portion of the drift region 90. The P-shield 40 helps deplete the upper portion of the drift region 90 when the device is off, and the higher dopant concentration in the upper portion of the drift region 90 lowers on-resistance when the device is on.

Figure 8:
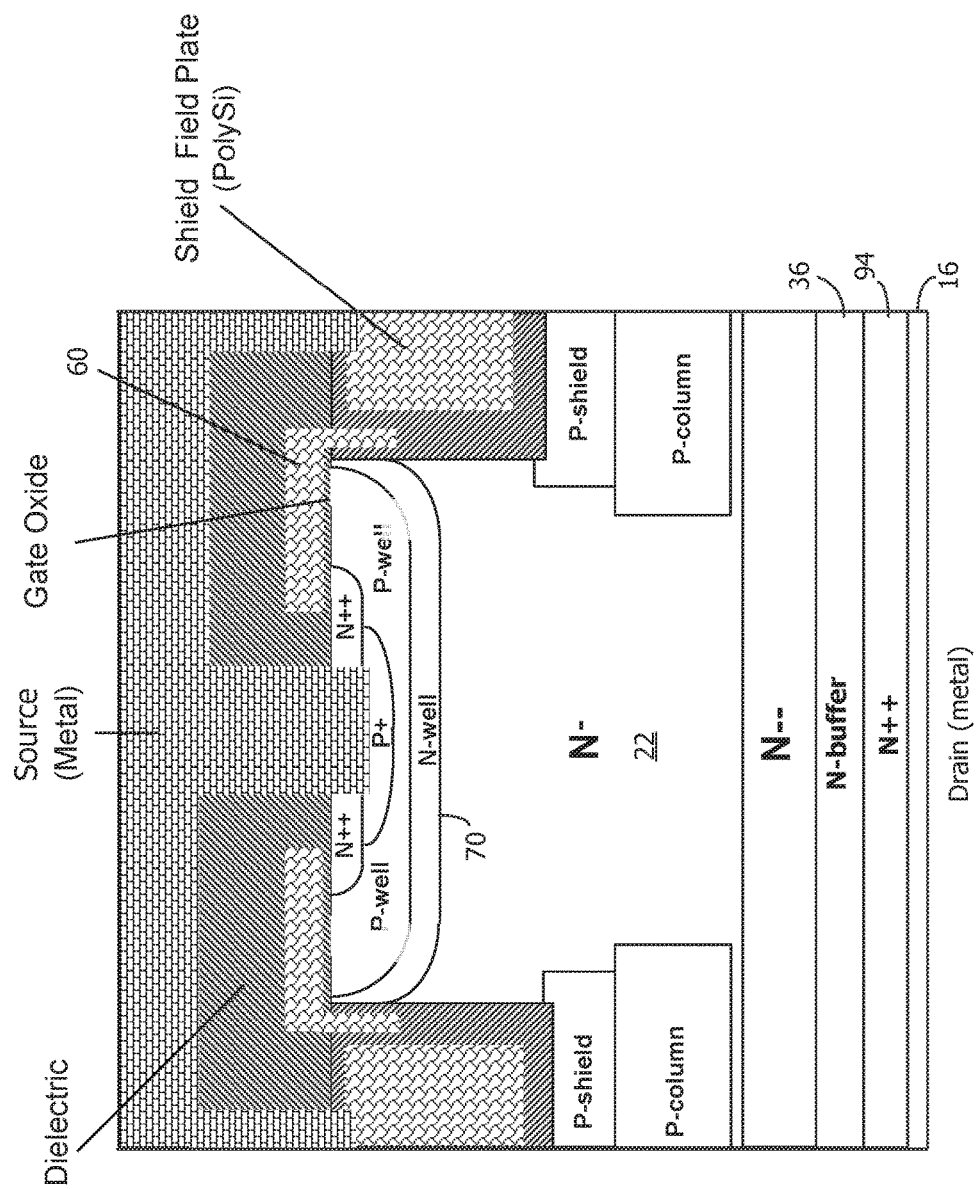
FIG. 8 illustrates the structure of FIG. 2 but where the substrate is N++ rather than P++, so is not an IGBT but a MOSFET.

FIG. 8 illustrates the structure of FIG. 2 but where the substrate 94 is N++ rather than P++, so the device operates as a vertical MOSFET rather than an IGBT. Similarly, the P++ substrate 50 in the other figures can be replaced with an N++ substrate. In other embodiments, dopants are implanted into the bottom surface of the substrate to achieve the desired type.

The processes used to fabricate the various embodiments may be similar to those shown in U.S. Pat. No. 9,761,702 but with the additional features.

The polarities of the various layers and regions may be made opposite depending on the type of IGBT or MOSFET needed. In all embodiments, SiC may be used instead of silicon.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A vertical transistor comprising a semiconductor substrate having a first electrode on its bottom surface;
   a first layer of a first conductivity type overlying the substrate, the first layer having a first dopant concentration;
   a first region of the first conductivity type overlying the first layer, the first region layer having a second dopant concentration higher than the first dopant concentration, the first region having a top surface;
   a trench having a vertical sidewall adjoining the first region, the trench containing a conductor insulated from the first layer and first region;

a second region of a second conductivity type overlying the top surface of the first region, the second region having a top surface;

a third region of the first conductivity type overlying the top surface of the second region, wherein an area between the third region and an edge of the second region comprises a channel for inversion by a gate;

a conductive gate insulated from and proximate to the channel for creating a conductive path in the channel when the gate is biased above a threshold voltage, the gate also being insulated from and proximate to the first region for increasing a carrier concentration in the first region along a vertical section of the first region when the gate is biased to turn the transistor on so as to form a vertical low-conductivity path through the first region; and a second electrode electrically contacting the second region and the third region, wherein when a voltage is applied between the first electrode and the second electrode and the gate is biased above the threshold voltage, a current flows between the first electrode and the second electrode.

2. The transistor of claim 1 wherein the substrate is of the first conductivity type and the transistor is a MOSFET.

3. The transistor of claim 1 wherein the substrate is of the second conductivity type and the transistor is an insulated gate bipolar transistor (IGBT).

4. The transistor of claim 1 wherein the channel is a lateral channel below a first portion of the gate, wherein the gate has a vertical extension that faces a side of the first region.

5. The transistor of claim 1 wherein the channel is a vertical channel and the gate is formed in the trench.

6. The transistor of claim 1 further comprising a vertical field plate in the trench facing a vertical sidewall of the first layer and insulated from the sidewall.

7. The transistor of claim 6 wherein the vertical field plate is electrically connected to the second electrode.

8. The transistor of claim 6 wherein the vertical field plate is electrically connected to the gate.

9. The transistor of claim 1 wherein the trench is along at least a portion of the first layer and the first region, the trench containing a conductive material, the transistor further comprising:

a doped shield region of the second conductivity type below the trench and contacting the first layer.

10. The transistor of claim 1 wherein the first region is formed as a well region surrounding the second region.

11. The transistor of claim 1 wherein the first region is formed as an epitaxial layer below the second region.

12. The transistor of claim 1 wherein the first region has a dopant concentration that is at least 1.5 times that of the first layer.

13. The transistor of claim 1 further comprising one or more floating fourth regions of the second conductivity type formed in the first layer.

14. A vertical transistor comprising
a semiconductor substrate having a first electrode on its bottom surface;

a first layer of a first conductivity type overlying the substrate;

a trench having a vertical sidewall, the trench containing a conductor insulated from the first layer;

a first region of a second conductivity type overlying the first layer, the first region having a top surface;

a second region of the first conductivity type overlying the top surface of the first region, wherein an area between the second region and an edge of the first region comprises a channel for inversion by a gate;

a conductive gate insulated from and proximate to the channel for creating a conductive path in the channel when the gate is biased above a threshold voltage;

at least one third region of the second conductivity type formed completely within the first layer, the at least one third region electrically floating; and a second electrode electrically contacting the first region and the second region, wherein when a voltage is applied between the first electrode and the second electrode and the gate is biased above the threshold voltage, a current flows between the first electrode and the second electrode.

15. The transistor of claim 14 wherein the at least one third region comprises a plurality of third regions.

16. The transistor of claim 14 wherein the trench is along at least a portion of the first layer, the trench containing a conductive material, the transistor further comprising:

a doped shield region of the second conductivity type below the trench and contacting the first layer.

17. The transistor of claim 14 wherein the substrate is of the first conductivity type and the transistor is a MOSFET.

18. The transistor of claim 14 wherein the substrate is of the second conductivity type and the transistor is an insulated gate bipolar transistor (IGBT).

19. The transistor of claim 14 wherein the channel is a lateral channel below a first portion of the gate, wherein the gate has a vertical extension that faces a side of the first region.

20. The transistor of claim 14 wherein the channel is a vertical channel and the gate is formed in the trench.

\* \* \* \* \*